(12) United States Patent
Chang et al.

(10) Patent No.: US 11,688,935 B2
(45) Date of Patent: Jun. 27, 2023

(54) ELECTRONIC DEVICE

(71) Applicant: MICROELECTRONICS TECHNOLOGY, INC., Hsinchu (TW)

(72) Inventors: Wen-Huang Chang, Hsinchu (TW); Cheng-Chia Chou, Hsinchu (TW); Yu-Hui Huang, Hsinchu (TW); Tung-Hua Yang, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 159 days.

(21) Appl. No.: 17/112,734

(22) Filed: Dec. 4, 2020

(65) Prior Publication Data

US 2021/0408674 A1 Dec. 30, 2021

Related U.S. Application Data

(60) Provisional application No. 63/046,078, filed on Jun. 30, 2020.

(51) Int. Cl.
| | |
|---|---|
| *H05K 7/20* | (2006.01) |
| *H01Q 1/42* | (2006.01) |
| *H01B 3/44* | (2006.01) |
| *H01Q 1/02* | (2006.01) |
| *H05K 1/02* | (2006.01) |

(52) U.S. Cl.
CPC ............ *H01Q 1/42* (2013.01); *H01B 3/441* (2013.01); *H01Q 1/02* (2013.01); *H05K 1/0203* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 5,216,435 A | * | 6/1993 | Hirata | H01Q 1/3275 343/705 |
| 5,359,337 A | * | 10/1994 | Eguchi | H01Q 1/18 342/359 |
| 6,346,919 B1 | * | 2/2002 | Wang | H01Q 1/38 343/769 |

(Continued)

FOREIGN PATENT DOCUMENTS

| | | |
|---|---|---|
| CN | 110718759 A | 1/2020 |
| CN | 110808443 A | 2/2020 |

(Continued)

OTHER PUBLICATIONS

Office Action and Search Report issued in CN110108710 dated Oct. 8, 2021 with English Abstract, 6 pages.

(Continued)

*Primary Examiner* — Krystal Robinson
(74) *Attorney, Agent, or Firm* — Muncy, Geissler, Olds & Lowe, P.C.

(57) ABSTRACT

An electronic device which includes a radome, a bottom cover connected to the radome, and a printed circuit board disposed between the radome and the bottom cover. The radome includes a top shell, an insulating member and at least one fastening members. The insulating member is made of expanded polystyrene and has at least one recess. The fastening member is embedded in the insulating member. The top shell covers the insulating member and includes polycarbonate.

11 Claims, 17 Drawing Sheets

(56) References Cited

U.S. PATENT DOCUMENTS

| | | | | |
|---|---|---|---|---|
| 8,857,716 B1 | * | 10/2014 | Giobbi | G08B 13/2462 |
| | | | | 235/435 |
| 2011/0109519 A1 | * | 5/2011 | Quan | H01Q 15/0006 |
| | | | | 343/756 |
| 2015/0116184 A1 | | 4/2015 | Curran | |

FOREIGN PATENT DOCUMENTS

| | | |
|---|---|---|
| CN | 210554537 U | 5/2020 |
| EP | 1089377A-2 | 4/2001 |
| GB | 2296385 A | 6/1996 |
| GB | 2373100 A | 9/2002 |

OTHER PUBLICATIONS

Communication and Search Report issued in EP21160697.5 dated Sep. 1, 2021, 11 pages.
An Office Action in corresponding JP Application No. 2021189353 dated Jan. 10, 2023, is attached, 2 pages and its English translation 1 page.

\* cited by examiner (A-A)

(B-B)

(C-C)

(D-D)

(E-E)

(F-F)

(G-G)

ELECTRONIC DEVICE

CROSS-REFERENCE TO RELATED APPLICATION

This application claims the priority benefit of U.S. provisional application Ser. No. 63/046,078 filed Jun. 30, 2020. The entirety of the above-mentioned patent application is hereby incorporated by reference herein and made a part of this specification.

TECHNICAL FIELD

The present disclosure relates to an electronic device, and more particularly, to an electronic device including a radome with an insulating member of expanded polystyrene.

DISCUSSION OF THE BACKGROUND

Ideally, the radio frequency (RF) signal may be transmitted through a radome with no loss. However, actually, it is impossible to make this kind of the radome. The loss may be reduced as low as possible by selecting material and designing shapes. Simultaneously, the polarization of the RF signal must be kept.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an electronic device including a radome; a bottom cover, connected to the radome; and a printed circuit board, disposed between the radome and the bottom cover.

In some embodiments, the radome includes an insulating member.

In some embodiments, the insulating member is made of expanded polystyrene (EPS).

In some embodiments, the insulating member has at least one recess.

In some embodiments, the radome further includes at least one fastening member, wherein the fastening member is embedded in the insulating member.

In some embodiments, the radome further includes a top shell, wherein the top shell covers the insulating member.

In some embodiments, the top shell comprises polycarbonate.

In some embodiments, the fastening member is rib-shaped.

In some embodiments, the fastening member includes two inserting sections and a connecting section, wherein the two inserting sections are connected to two ends of the connecting section.

In some embodiments, each of the two inserting sections has a disk part, a cylinder part and four rectangular parts, wherein the disk part is connected to the corresponding end of the connecting section, the cylinder part is disposed on the disk part and at a center of the disk part, and the four rectangular parts are angularly disposed on the disk part and surround the cylinder part.

In some embodiments, one of the four rectangular parts is directly connected to the corresponding end of the connecting section and an arc is formed therebetween.

In some embodiments, the top shell and the fastening member are integrally formed in one piece.

In some embodiments, the top shell, the insulating member and the fastening member are integrally form in one piece.

In some embodiments, the top shell has a low dielectric constant and high resistance to high temperature.

In some embodiments, the insulating member has a low dielectric constant for providing mechanical support to the fastening member.

In some embodiments, the top shell is formed by vacuum molding.

In some embodiments, the radome is square.

In some embodiments, the top shell has a convex surface.

In some embodiments, the bottom cover has at least one receiving cavity fir receiving the printing circuit board.

In some embodiments, the bottom cover has a plurality of cooling fins, wherein the cooling fins are disposed at one side of the bottom cover opposite to the receiving cavity.

Due to the design of the electronic device of the present disclosure, the radome has the insulating member made of expanded polystyrene (EPS) and the top shell with a low dielectric constant and high resistance to high temperature, the radiation pattern what the RF signal transmitted through the radome of the present disclosure is close to the one what the RF signal directly transmitted without radome. That is, the loss of the RF signal transmitted through the radome may be reduce as low as possible. Additionally, the radome further includes at least one fastening member embedded in the insulating member, the shape of the radome may be kept and the radome is firm to prevent the radome from deformation.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
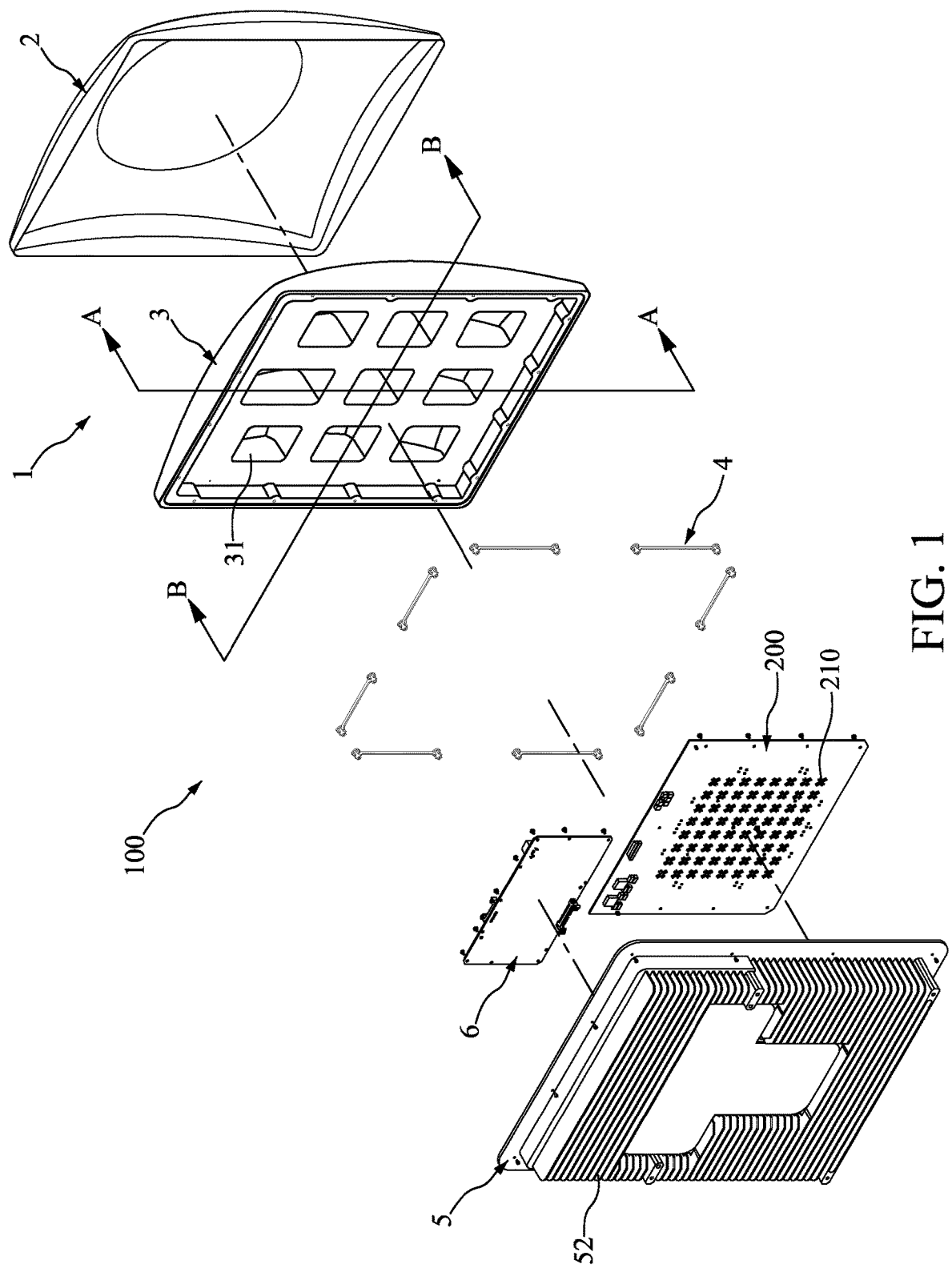
FIG. 1 is an exploded view of an electronic device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, above (or up) corresponds to the direction of the arrow of the direction Z, and below (or down) corresponds to the opposite direction of the arrow of the direction Z.

Figure 2:
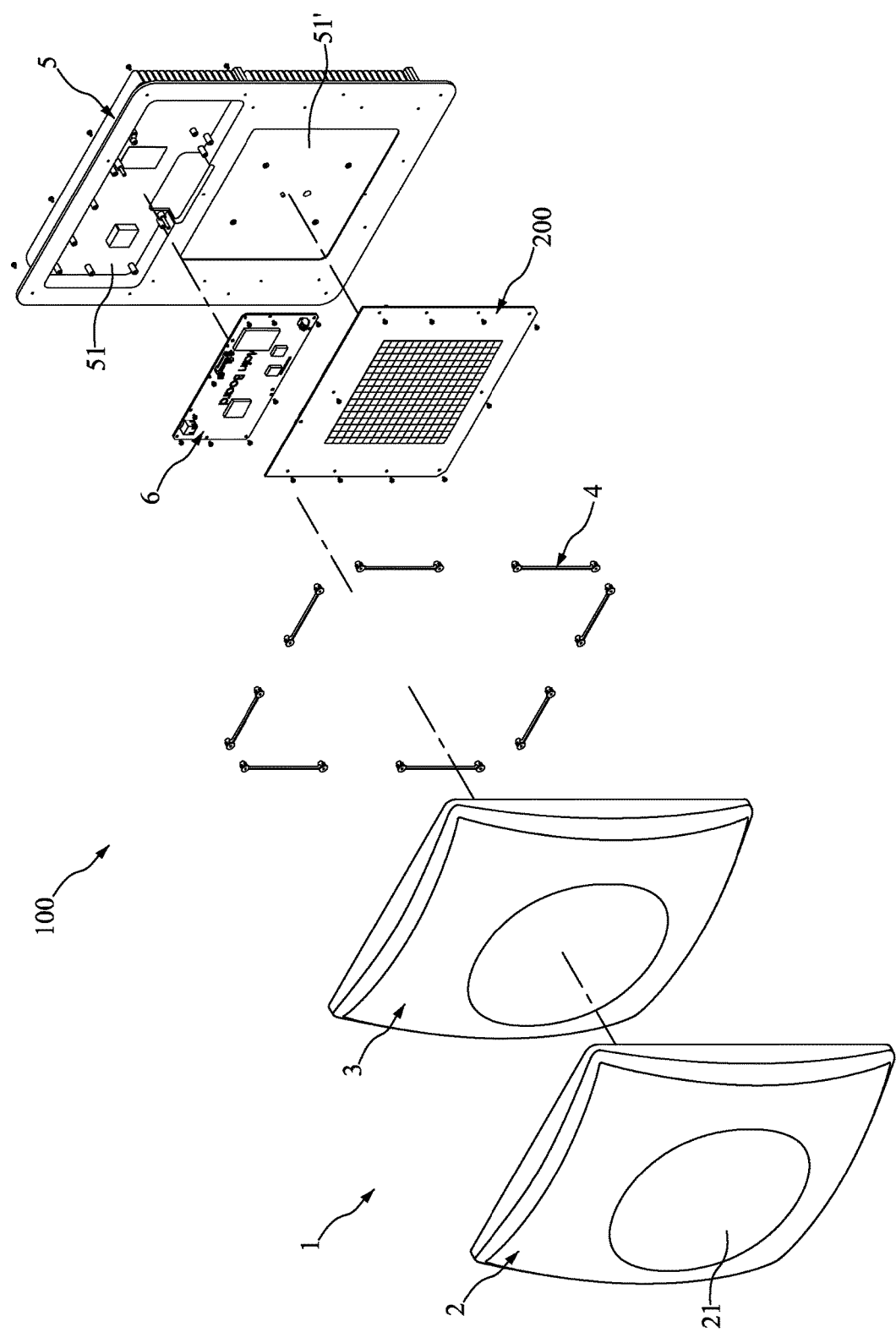
FIG. 2 is another exploded view of the electronic device in accordance with one embodiment of the present disclosure.
Figure 3:
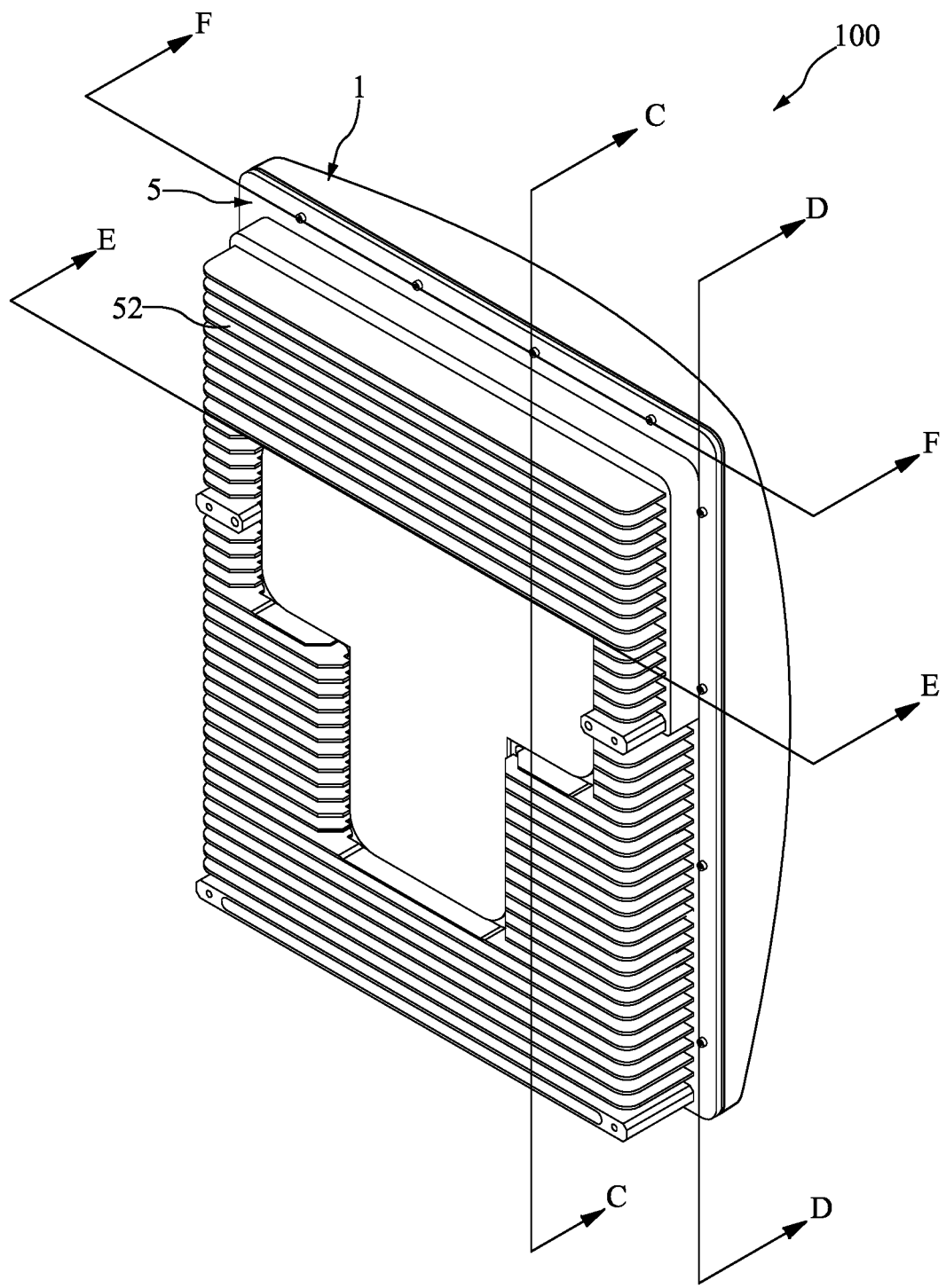
FIG. 3 is a perspective view of the electronic device in accordance with one embodiment of the present disclosure.
Figure 4:
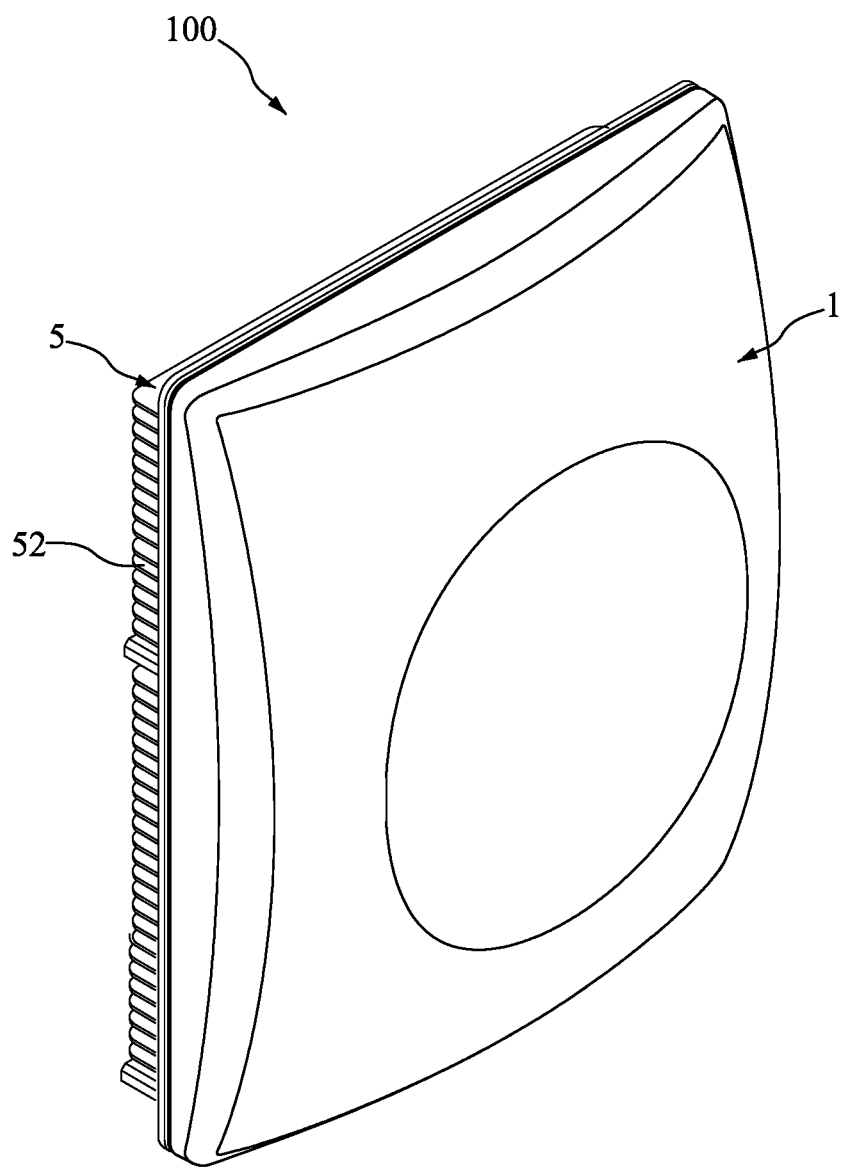
FIG. 4 is another perspective view of the electronic device in accordance with one embodiment of the present disclosure.
Figure 5:
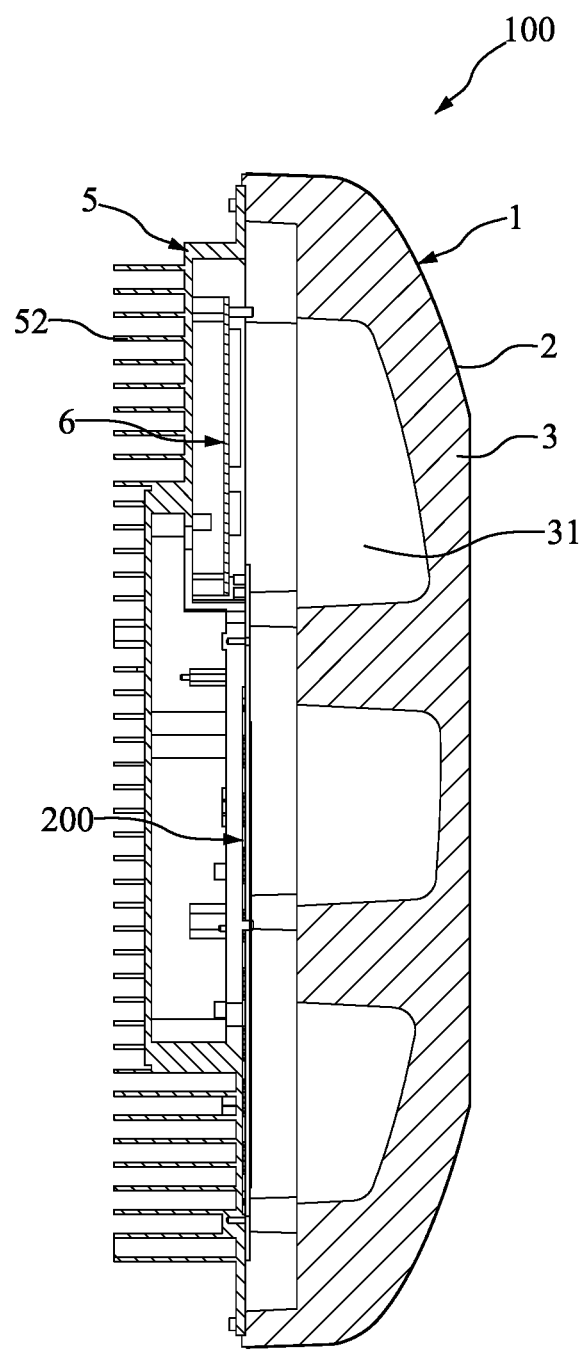
FIG. 5 is a cross sectional view of FIG. 3 along line A-A.
Figure 6:
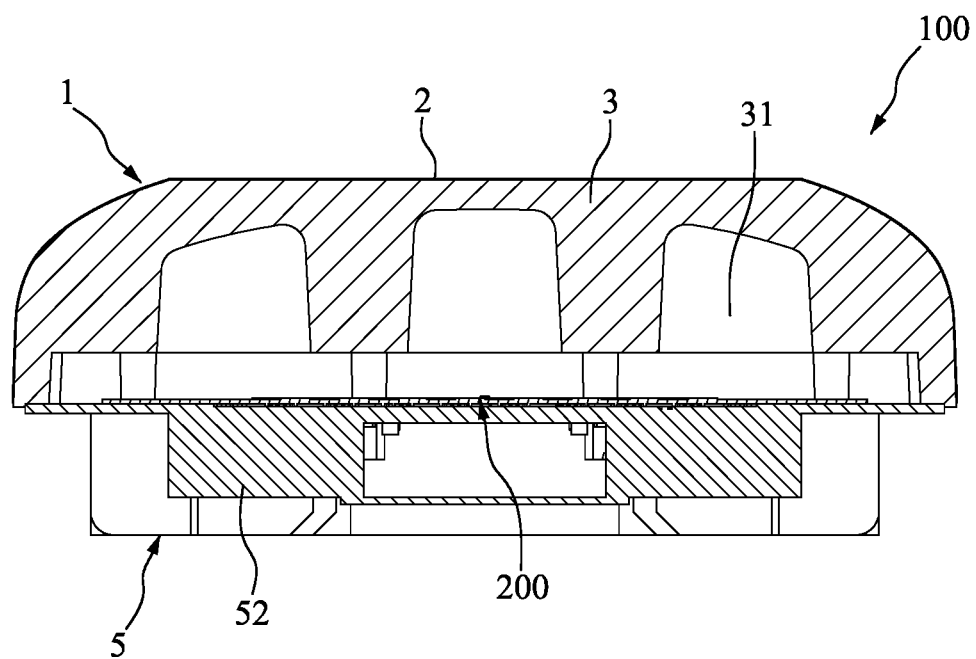
FIG. 6 is a cross sectional view of FIG. 3 along line B-B.
Figure 7:
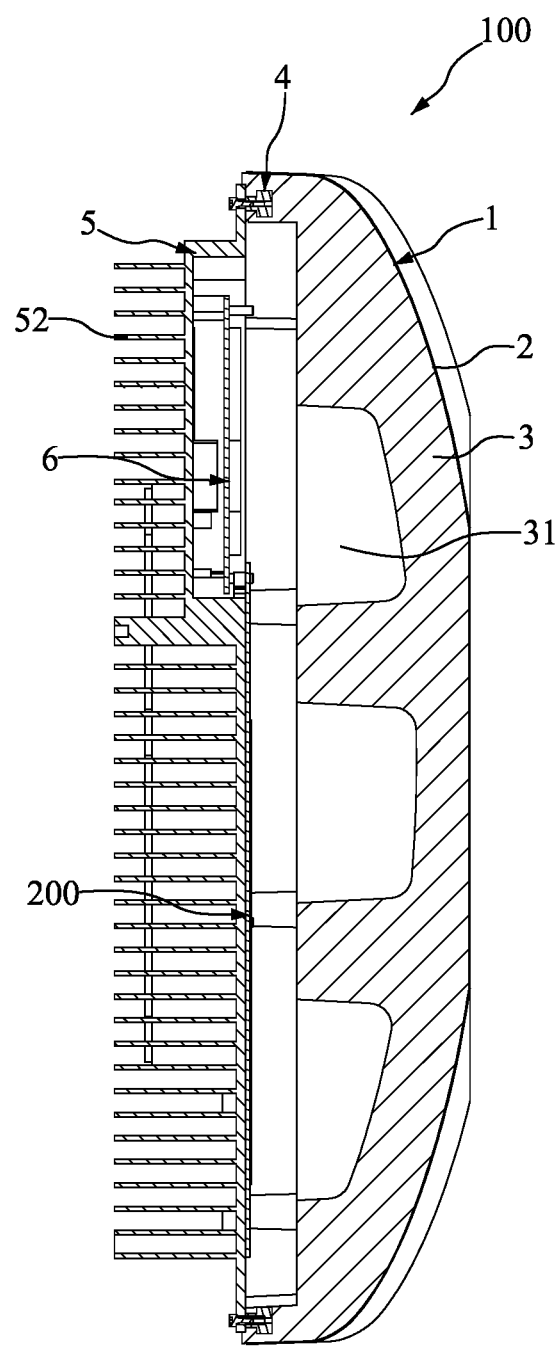
FIG. 7 is a cross sectional view of FIG. 3 along line C-C.
Figure 8:
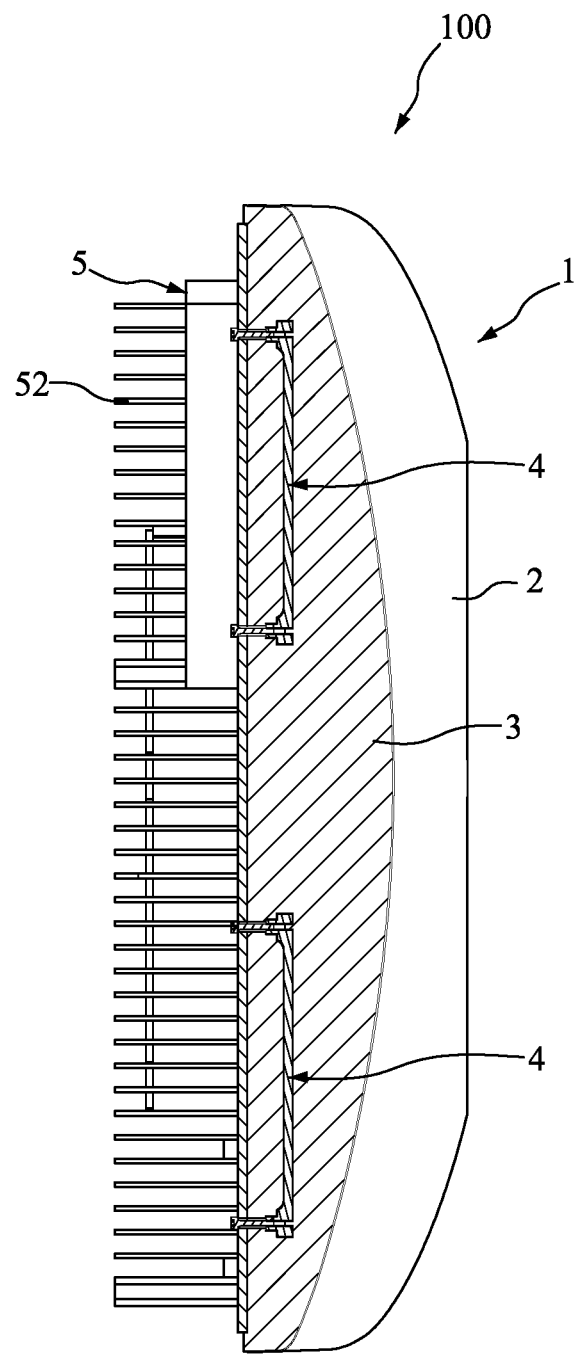
FIG. 8 is a cross sectional view of FIG. 3 along line D-D.
Figure 9:
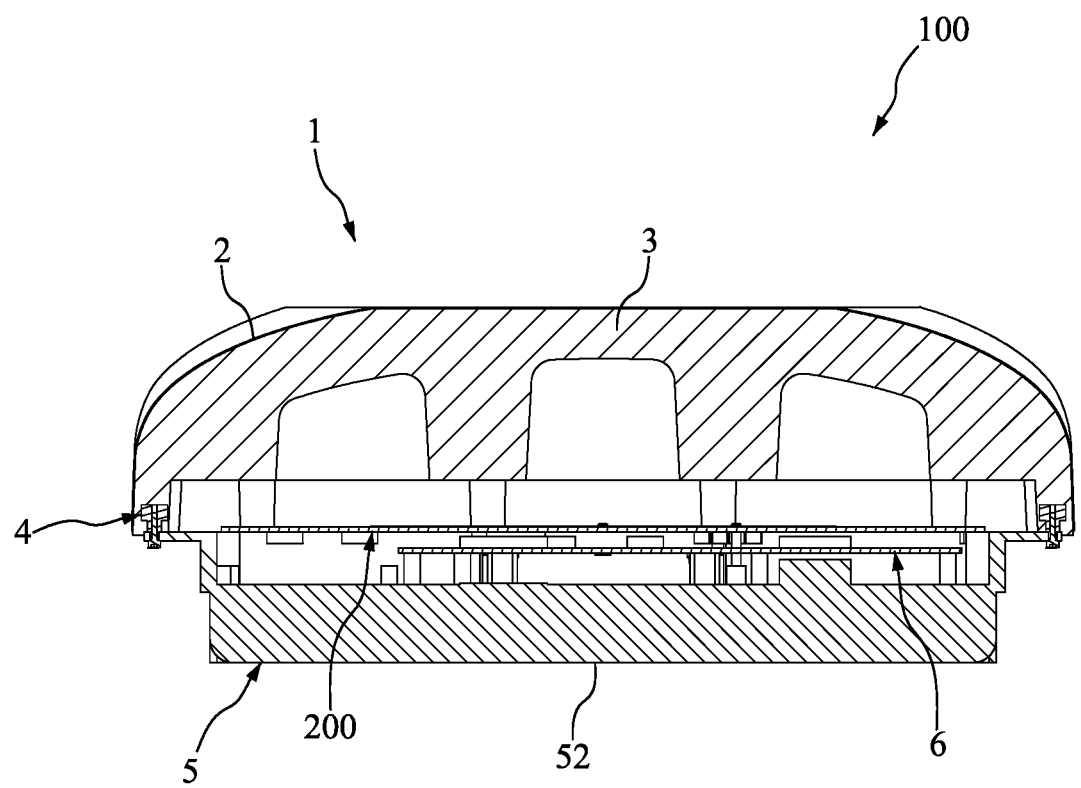
FIG. 9 is a cross sectional view of FIG. 3 along line E-E.
Figure 10:
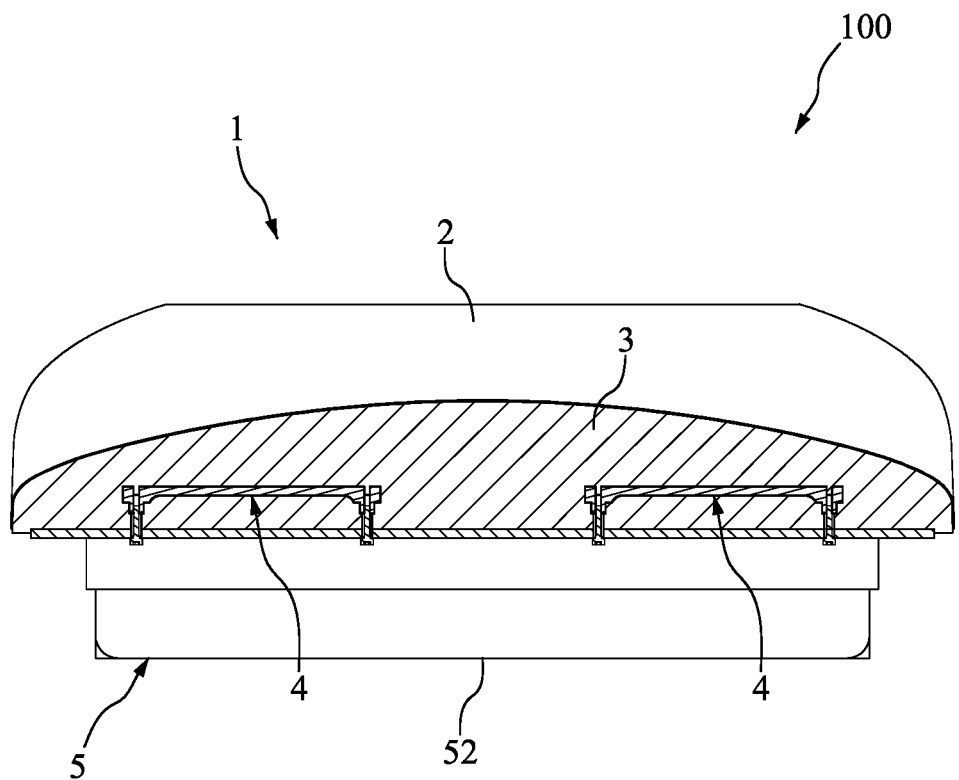
FIG. 10 is a cross sectional view of FIG. 3 along line F-F.

FIG. 1 is an exploded view of an electronic device in accordance with one embodiment of the present disclosure. FIG. 2 is another exploded view of the electronic device in accordance with one embodiment of the present disclosure. FIG. 3 is a perspective view of the electronic device in accordance with one embodiment of the present disclosure. FIG. 4 is another perspective view of the electronic device in accordance with one embodiment of the present disclosure. FIG. 5 is a cross sectional view of FIG. 3 along line A-A. FIG. 6 is a cross sectional view of FIG. 3 along line B-B. FIG. 7 is a cross sectional view of FIG. 3 along line C-C. FIG. 8 is a cross sectional view of FIG. 3 along line D-D. FIG. 9 is a cross sectional view of FIG. 3 along line E-E. FIG. 10 is a cross sectional view of FIG. 3 along line F-F.

Please refer to FIGS. 1 to 10, the electronic device 100 may include a radome 1, a bottom cover 5 and a printed circuit board 6. The bottom cover 5 is connected to the radome 1. The printed circuit board 6 is disposed between the radome 1 and the bottom cover 5.

In some embodiments, the radome 1 is square. Therefore, the structure of the radome 1 is symmetrical, and then the RF signal may be transmitted evenly.

Figure 11:
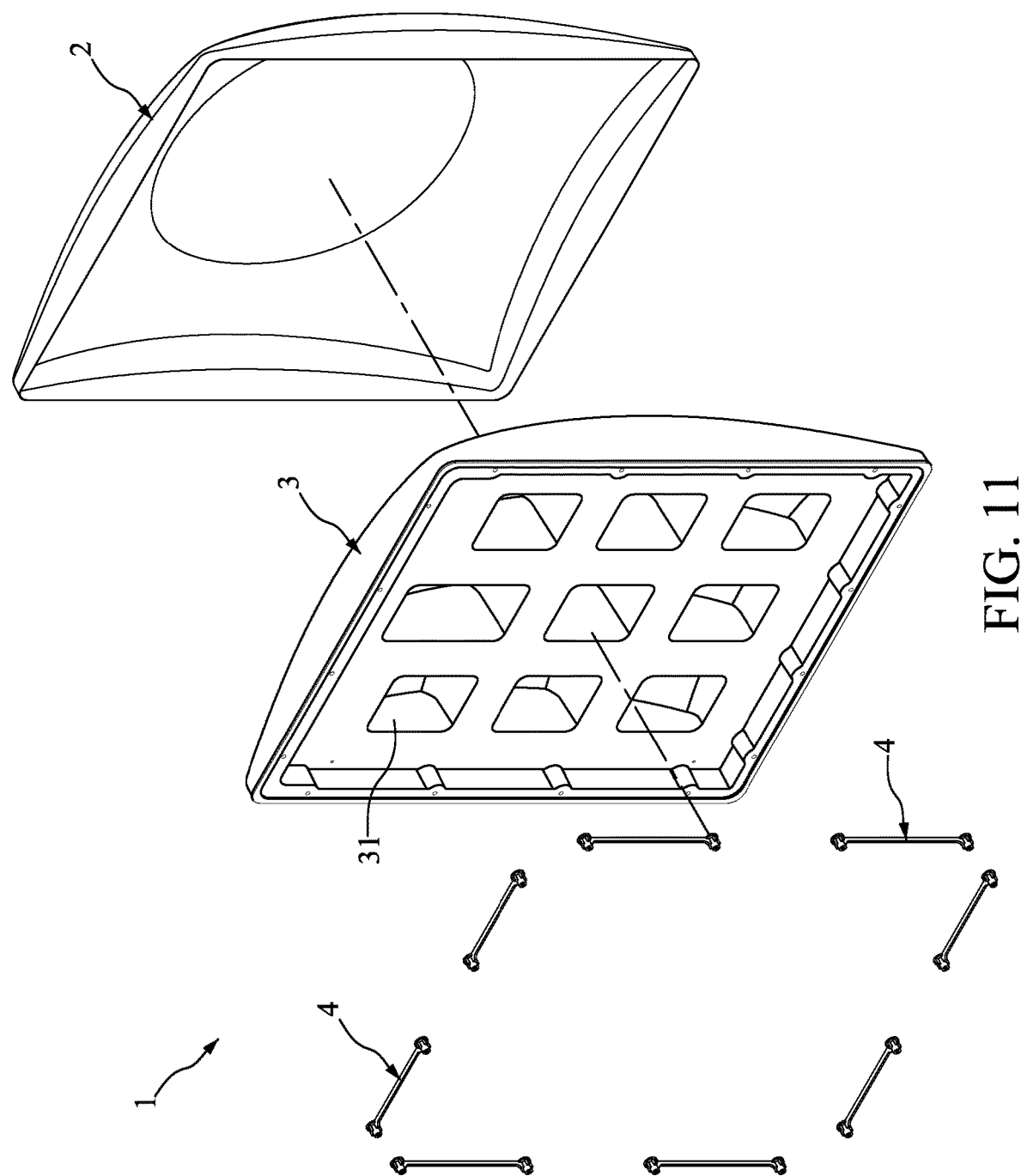
FIG. 11 is an exploded view of a radome of the electronic device in accordance with one embodiment of the present disclosure.
Figure 12:
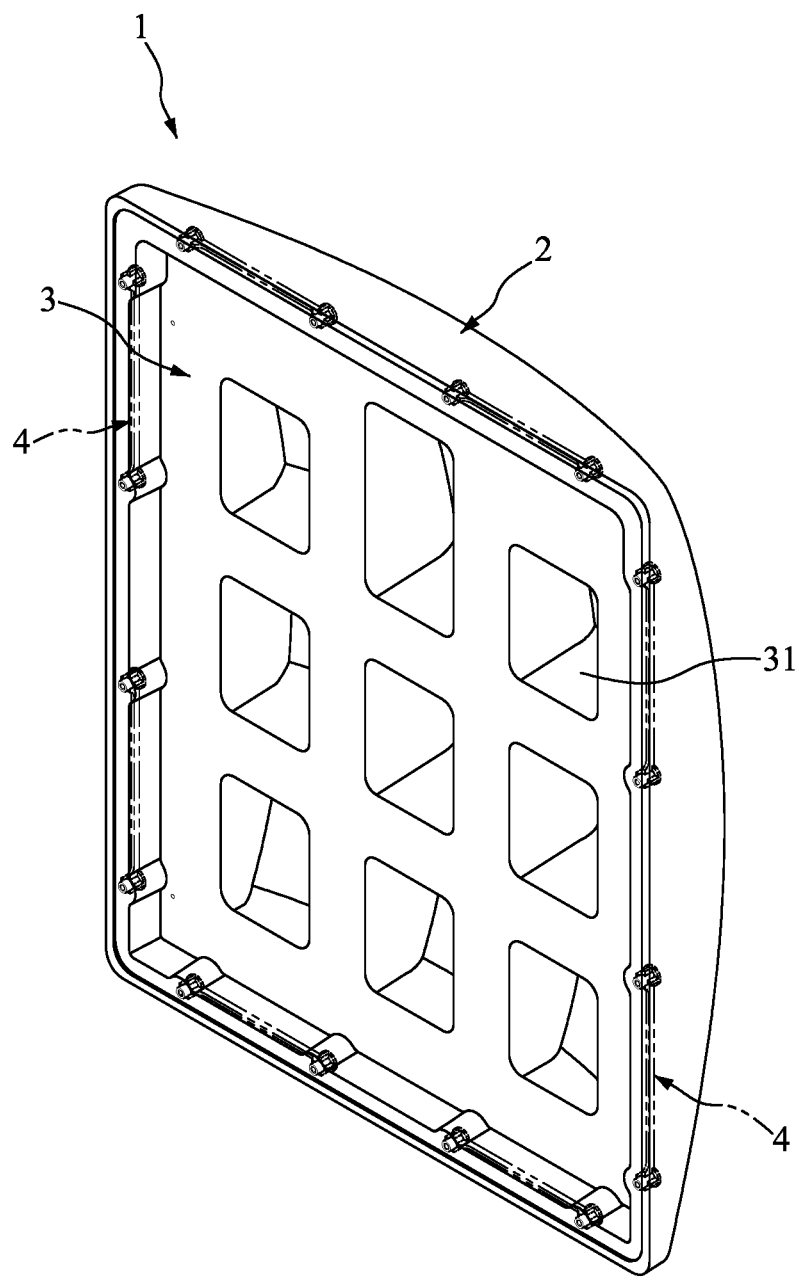
FIG. 12 is a perspective view of the radome of the electronic device in accordance with one embodiment of the present disclosure while the radome includes the fastening members.
Figure 13:
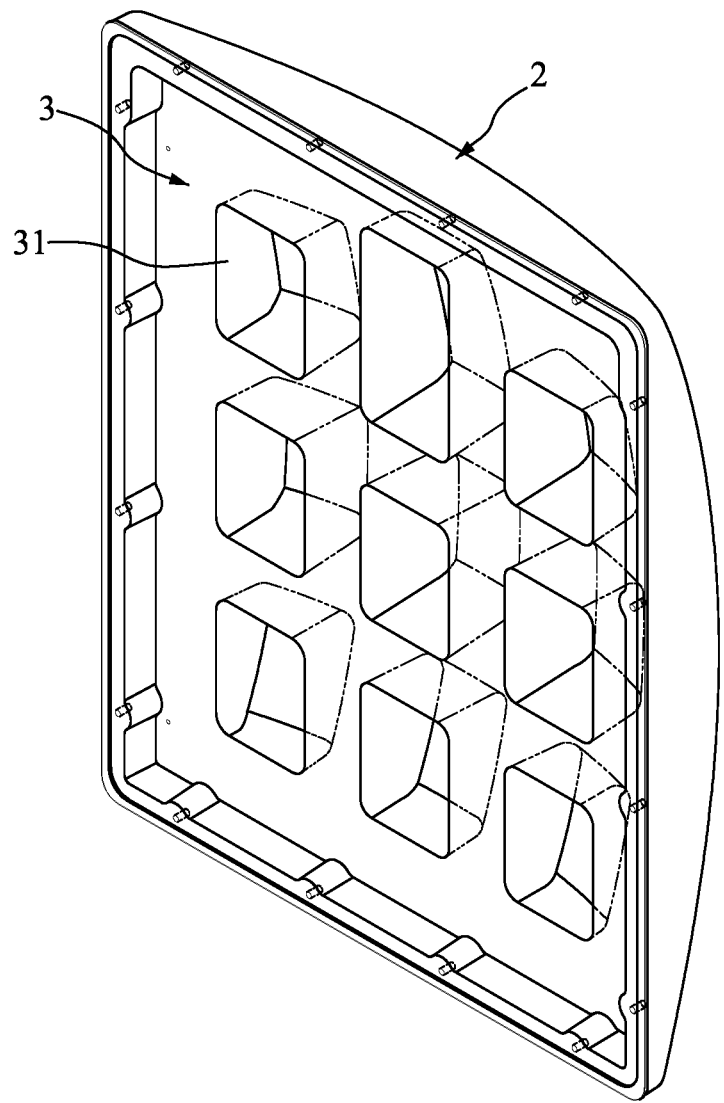
FIG. 13 is a perspective view of the radome of the electronic device in accordance with one embodiment of the present disclosure while the radome is without the fastening members.

FIG. 11 is an exploded view of a radome of the electronic device in accordance with one embodiment of the present disclosure. FIG. 12 is a perspective view of the radome of the electronic device in accordance with one embodiment of the present disclosure while the radome includes the fastening members. FIG. 13 is a perspective view of the radome of the electronic device in accordance with one embodiment of the present disclosure while the radome is without the fastening members.

Please refer to FIGS. 11 to 13, the radome 1 may include a top shell 2, an insulating member 3 and at least one fastening members 4. In some embodiments, the quantity of the fastening members 4 is eight for illustration, but not limited thereto.

Please refer to FIGS. 11 and 12, the top shell 2 covers the insulating member 3. In some embodiments, the top shell 2 has a convex surface 21. In some embodiments, the top shell 2 comprises polycarbonate. Therefore, the RF signal (not shown) transmitted through the radome 1 may be not interfered and the loss may be reduced as low as possible.

In some embodiments, the insulating member 3 is made of expanded polystyrene (EPS), The insulating member 3 may have at least one recess 31. In some embodiments, the quantity of the recess 31 is nine, and the nine recesses 31 are arranged in a matrix, but not limited thereto.

Please refer to FIGS. 1 to 13, the fastening members 4 are embedded in the insulating member 3. In some embodiments, the fastening member 4 is rib-shaped.

Figure 14:
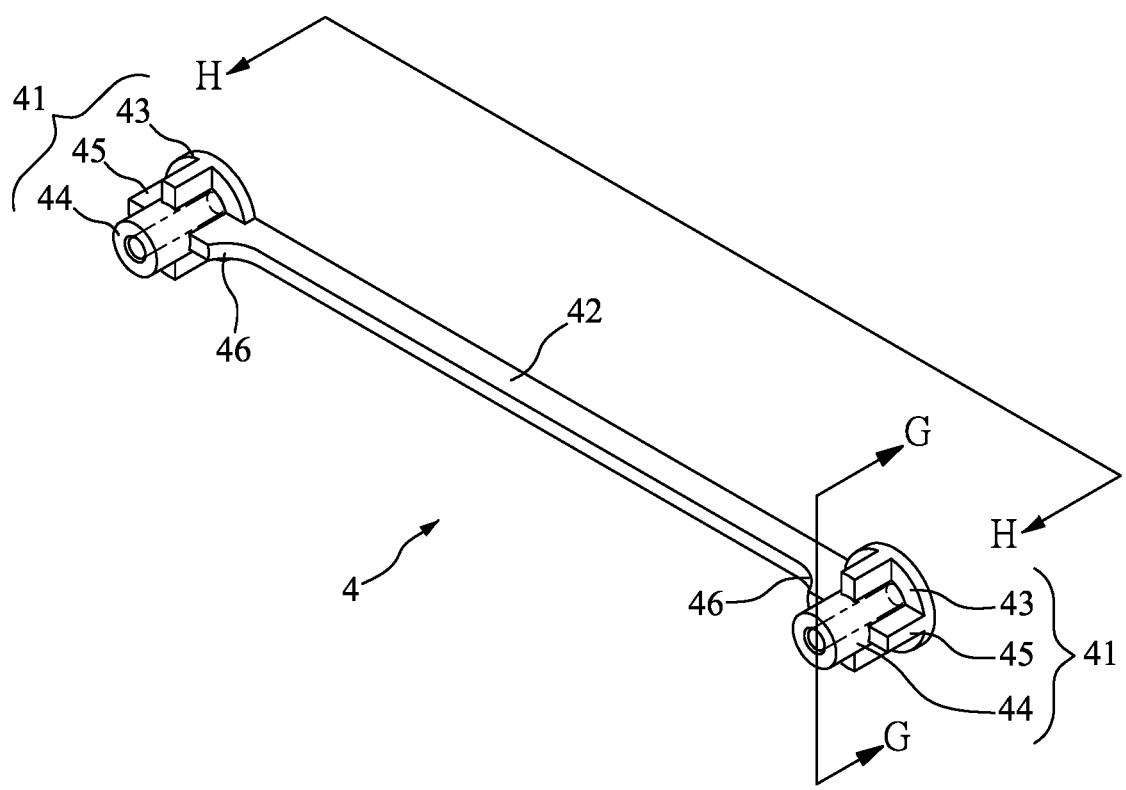
FIG. 14 is a perspective view of a fastening member of the radome of the electronic device in accordance with one embodiment of the present disclosure.
Figure 15:
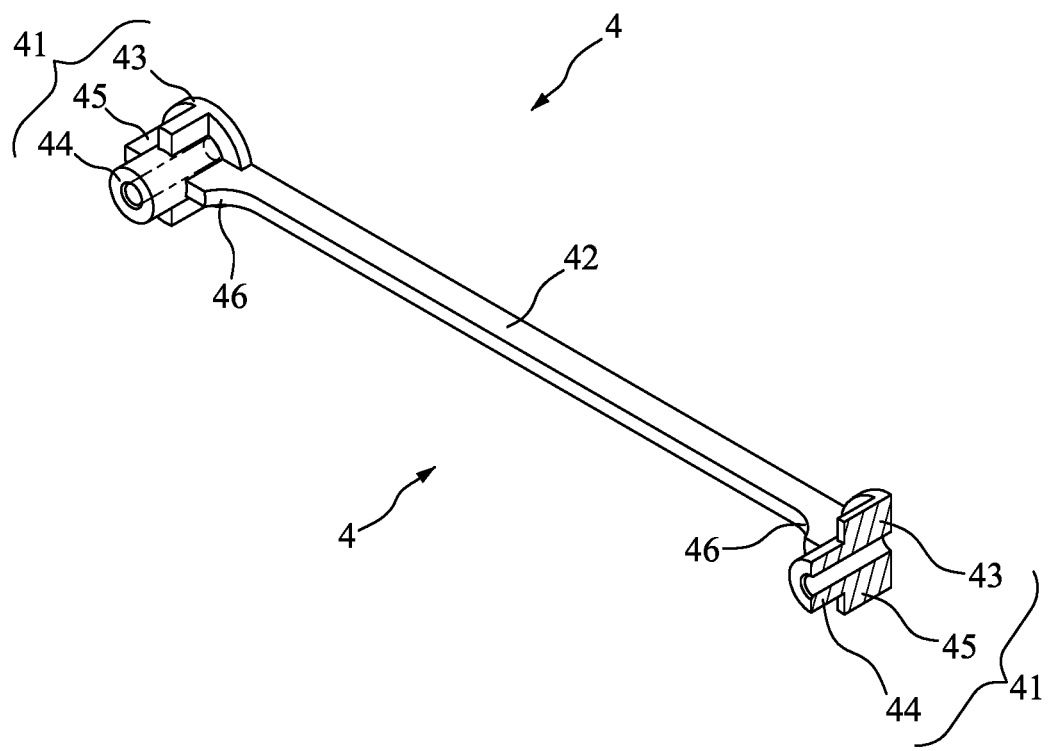
FIG. 15 is a cross sectional view of FIG. 14 along line G-G.
Figure 16:
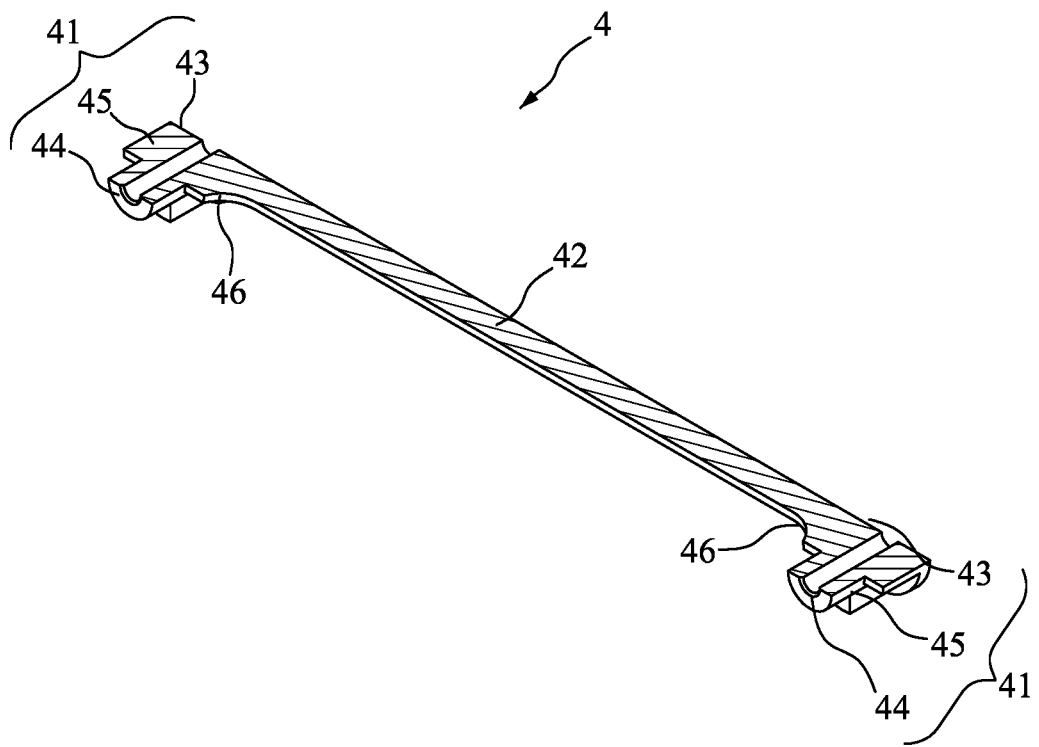
FIG. 16 is a cross sectional view of FIG. 14 along line H-H.

FIG. 14 is a perspective view of a fastening member of the radome of the electronic device in accordance with one embodiment of the present disclosure. FIG. 15 is a cross sectional view of FIG. 14 along line G-G. FIG. 16 is a cross sectional view of FIG. 14 along line H-H.

Please refer to FIGS. 14 to 16, the fastening member 4 includes two inserting sections 41 and a connecting section 42. The two inserting sections 41 are connected to two ends of the connecting section 42. In some embodiments, each of the two inserting sections 41 has a disk part 43, a cylinder part 44 and four rectangular parts 45. The disk part 43 is connected to the corresponding end of the connecting section 42. The cylinder part 44 is disposed on the disk part 42 and at a center of the disk part 42. The four rectangular parts 45 are angularly disposed on the disk part 42 and surround the cylinder part 44.

In some embodiments, one of the four rectangular parts 45 is directly connected to the corresponding end of the connecting section 42 and an arc 46 is formed therebetween.

In some embodiments, the top shell 2 is formed by vacuum molding. Then, the top shell 2 and the fastening members 4 are placed in an EPS mold cavity (not shown), and an EPS foaming process is performed. While EPS foams, the top shell 2 and fastening members 4 are combined to form the one-piece radome 1.

In some embodiments, the top shell 2 has a low dielectric constant and high resistance to high temperature. The insulating member 3 has a low dielectric constant for providing mechanical support to the fastening members 4, The top shell 2, the insulating member 3 and the fastening members 4 may integrally form the radome 1 in one piece without using adhesion agent. Therefore, the shape of the radome 1 may be kept and the radome 1 is firm to prevent the radome from deformation.

Please refer to FIGS. 1 to 4, the bottom cover 5 has at least one receiving cavity 51 for receiving the printing circuit board 6. In some embodiments, another receiving cavity 51' may receive an antenna plate 200. A plurality of antennas 210 are mounted on the antenna plate 200.

Please refer to FIGS. 1 to 10, the bottom cover 5 has a plurality of cooling fins 52. The cooling fins 52 are disposed at one side of the bottom cover 5 opposite to the receiving cavity 51, 51'. Therefore, the heat generated from the printed circuit board 6 and/or the antenna plate 200 may be dissipated.

Figure 17:
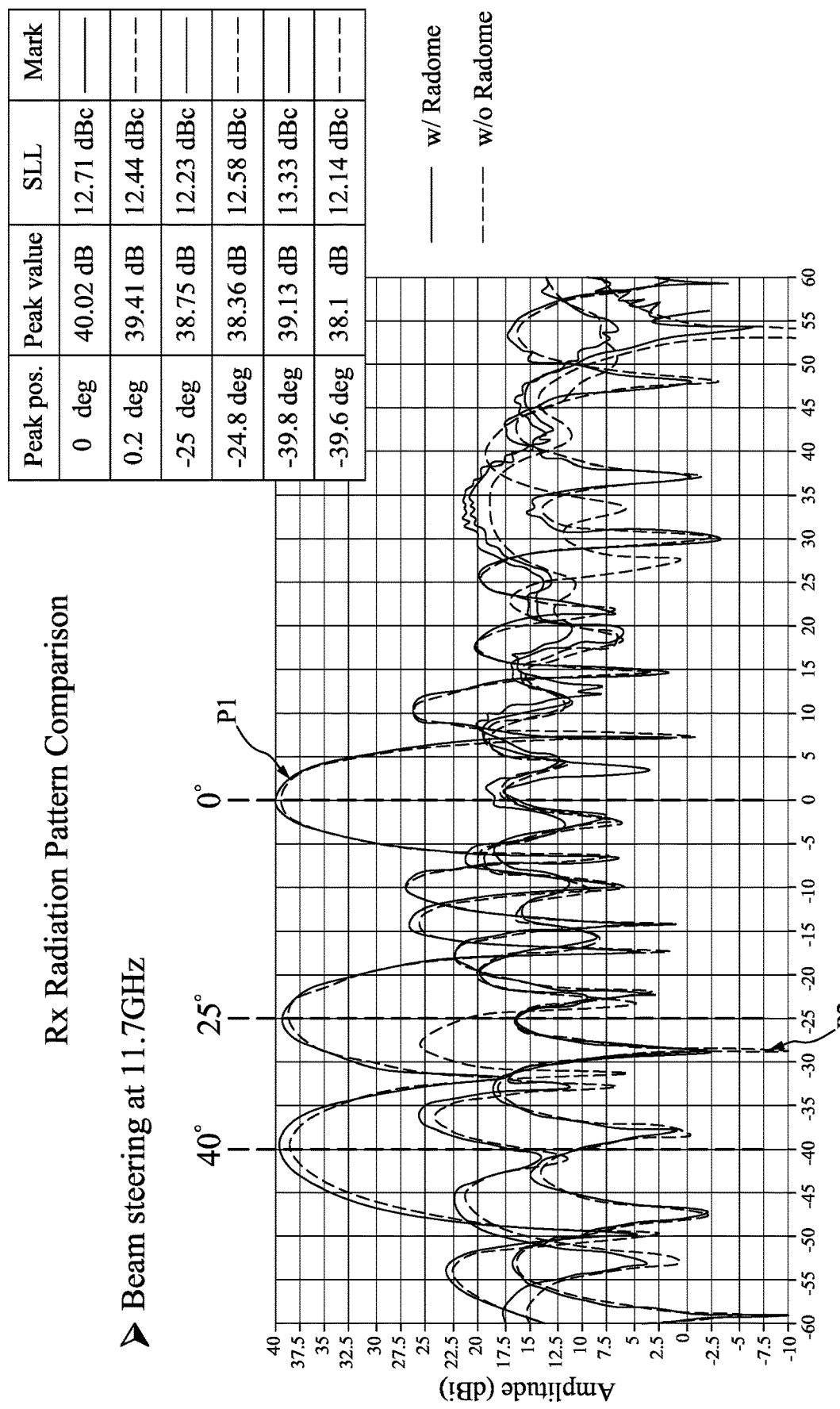
FIG. 17 is a chart showing a radiation pattern when an RF signal transmitted through the radome of the present disclosure as compared with the RF signal directly transmitted without radome.

FIG. 17 is a chart showing a radiation pattern when an RF signal transmitted through the radome of the present disclosure as compared with the RF signal directly transmitted without radome.

Please refer to FIG. 17, the radiation pattern P1 shown by a solid line represents the RF signal transmitted through the radome of the present disclosure, and the radiation pattern P2 shown by a dash line represents the RF signal directly transmitted without radome is. The horizontal axis indicates a radiation angle (theta, θ), and the vertical axis indicates an amplitude (dB). It is obviously shown that the radiation pattern P1 at the radiation angles 0, 25, 40 is close to the radiation pattern P2, i.e., the RF signal is transmitted through the radome of the present disclosure substantially in a lossless manner.

Due to the design of the electronic device of the present disclosure, the radome 1 has the insulating member 3 made of expanded polystyrene (EPS) and the top shell 2 with the low dielectric constant and high resistance to high temperature, the radiation pattern P1 what the RE signal transmitted through the radome 1 of the present disclosure is close to the radiation pattern P2 what the RE signal directly transmitted without radome. That is, the loss of the RE signal transmitted through the radome 1 may be reduce as low as possible. Additionally, the radome 1 further includes at least one fastening member 4 embedded in the insulating member 3, the shape of the radome 1 may be kept and the radome 1 is firm to prevent the radome 1 from deformation.

One aspect of the present disclosure provides an electronic device including a radome; a bottom cover, connected to the radome; and a printed circuit board, disposed between the radome and the bottom cover.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. An electronic device, comprising:
    a radome including an insulating member of expanded polystyrene (EPS) and having at least one recess;
    a bottom cover, connected to the radome; and
    a printed circuit board, disposed between the radome and the bottom cover,
    wherein the bottom cover has at least one receiving cavity for receiving the printing circuit board;
    wherein the radome further includes at least one fastening member embedded in the insulating member,
    wherein the fastening member includes two inserting sections and a connecting section, and the two inserting sections are connected to two ends of the connecting section, and
    wherein each of the two inserting sections has a disk part, a cylinder part and four rectangular parts, wherein the disk part is connected to the corresponding end of the connecting section, the cylinder part is disposed on the disk part and at a center of the disk part, and the four rectangular parts are angularly disposed on the disk part and surround the cylinder part.

2. The electronic device of claim 1, wherein the radome further includes a top shell covering the insulating member.

3. The electronic device of claim 2, wherein the top shell comprises polycarbonate.

4. The electronic device of claim 2, wherein the top shell and the fastening member are integrally formed in one piece.

5. The electronic device of claim 2, wherein the top shell, the insulating member and the fastening member are integrally form in one piece.

6. The electronic device of claim 2, wherein the top shell is formed by vacuum molding.

7. The electronic device of claim 2, wherein the top shell has a convex surface.

8. The electronic device of claim 1, wherein the fastening member is rib-shaped.

9. The electronic device of claim 1, wherein one of the four rectangular parts is directly connected to the corresponding end of the connecting section and an arc is formed therebetween.

10. The electronic device of claim 1, wherein the radome is substantially square.

11. The electronic device of claim 1, wherein the bottom cover has a plurality of cooling fins, wherein the cooling fins are disposed at one side of the bottom cover opposite to the receiving cavity.

\* \* \* \* \*